(12) United States Patent
Song et al.

(10) Patent No.: US 8,378,224 B2
(45) Date of Patent: Feb. 19, 2013

(54) TAPE FOR SEMICONDUCTOR PACKAGE AND CUTTING METHOD THEREOF

(75) Inventors: Hangbin Song, Beijing (CN); Peng Wang, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 945 days.

(21) Appl. No.: 11/956,932

(22) Filed: Dec. 14, 2007

(65) Prior Publication Data

US 2008/0185171 A1 Aug. 7, 2008

(30) Foreign Application Priority Data

Feb. 6, 2007 (CN) ...................... 2007 2 0103481 U

(51) Int. Cl.
*H05K 1/03* (2006.01)
(52) U.S. Cl. ...................................................... 174/255
(58) Field of Classification Search .................. 174/250, 174/254, 261, 262; 361/767, 777, 778
See application file for complete search history.

(56) References Cited

U.S. PATENT DOCUMENTS

| 7,049,687 B2 * | 5/2006 | Takahashi et al. ............. 257/673 |
| 2008/0316715 A1 * | 12/2008 | Fujii .............................. 361/748 |

FOREIGN PATENT DOCUMENTS

| JP | 07-007046 A | 1/1995 |
| JP | 10-214857 A | 8/1998 |
| JP | 11-097492 A | 4/1999 |
| JP | 2006-013230 A | 1/2006 |
| JP | 2007-048873 A | 2/2007 |

* cited by examiner

*Primary Examiner* — Jeremy Norris
*Assistant Examiner* — Tremesha S Willis

(57) ABSTRACT

A tape for a semiconductor package is provided. The tape comprises a base comprising a plurality of cutting areas, leads formed in each of the cutting areas on the base, and narrow wires connected to the corresponding leads. The narrow wires in at least one of the cutting areas are offset from central lines of the corresponding leads.

14 Claims, 2 Drawing Sheets

TAPE FOR SEMICONDUCTOR PACKAGE AND CUTTING METHOD THEREOF

The present application claims the priority of Chinese utility model application No. 200720103481.4 filed with the Chinese Intellectual Property Office on Feb. 6, 2007, which is incorporated herewith by reference.

BACKGROUND OF THE INVENTION

The present invention relates to a tape for semiconductor package and a method of cutting thereof.

Tape automated bonding (TAB) was introduced as a replacement for a conventional wire bonding technology. TAB is now used for a semiconductor package such as a tape carrier package (TCP) and a chip on film (COF) in liquid crystal displays, watches, cameras, memory cards, calculators, personal computers and other electronic devices. TAB provides a high-density interconnect from IC chips to substrate, allowing full automation of the bonding of one end of the tape wiring pattern to the IC chips and the other end of the tape wiring pattern to the substrate.

FIG. 5 is a schematic view showing a conventional (TAB/COF) tape with a lead pattern on a base, in which a lead spacing A is 27 μm, a distance B between the central lines of two adjacent leads 1 is 58 μm. A narrow wire 2 provided at the end of each lead 1 is uniformly formed at the central line of the correspondingly lead 1 so as to provide a central narrow wire pattern as show in FIG. 5. The production process shows that such central narrow wire pattern is prone to result in some technical defects when cutting the narrow wires, such as reducing life of a cutting tool and producing burrs at cut edges of the cutted narrow wires and the like.

When the conventional TAB/COF tapes are sequentially cut with a cutting tool, the cutting positions of the cutting tool for the narrow wires of each tape are constant in the continuous operations, and thereby these positions of the blade of the cutting tool are subject to repeating wear. The life of the cutting tool is only about 100,000 times of cutting. If the cutting tool cannot be replaced in time, the worn cutting tool will generate burrs at the cut edges. When a burr is larger than 15 μm in length, it may cause a short between two adjacent leads, resulting in two-bright line (two-line) defect.

SUMMARY OF THE INVENTION

Embodiments of the present invention provide a tape for semiconductor package in view of the problems such as reduced life of a cutting tool and the two-line defects resulting from edge burrs.

In an embodiment, the invention provides a tape for semiconductor package comprising a base and leads and narrow wires connected to corresponding leads on the base. The base comprises a plurality of cutting areas. Leads and narrow wires are formed in each of the cutting areas. The narrow wires in at least one of the cutting areas are offset from central lines of the corresponding leads.

Preferably, the narrow wires in the at least one of the cutting areas may be offset from central lines of the corresponding leads towards a same direction, and alternatively, the adjacent narrow wires in the at least one of the cutting areas may be offset from central lines of the corresponding leads towards opposite directions.

Preferably, an offset distance between a central line of a narrow wire and a central line of the corresponding lead is 11 μm~15 μm, more preferably 13 μm.

In another embodiment of the invention, there is provided a method for cutting a tape for semiconductor package. The tape comprises a base having plurality of cutting areas, and leads and narrow wires connected to corresponding leads which are formed within each of the cutting areas on the base. The narrow wires in at least one of the cutting areas are offset from central lines of the corresponding leads.

Preferably, the narrow wires may be arranged differently in the two adjacent cutting areas.

Preferably, all the narrow wires in one of the cutting areas may be offset from central lines of the corresponding leads towards a same direction, and alternatively, the adjacent narrow wires in one of the cutting area may be offset from central lines of the corresponding leads towards opposite directions.

Preferably, an offset distance between a central line of a narrow wire and a central line of the corresponding lead is 11 μm~15 μm, more preferably 13 μm.

Preferably, the tape for semiconductor package may be a TAB/COF tape.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The foregoing and other features, aspects and advantages of the present invention will become more apparent from the following detailed description of the exemplary embodiments when taken in conjunction with the accompanying drawings, in which.

DETAILED DESCRIPTION OF THE PREFERRED EMBODIMENTS

It should be understood that the detailed description and specific examples, while indicating preferred embodiments of the invention, are given by way of illustration only, since various changes and modifications within the spirit and scope of the invention will become apparent to those skilled in the art from the following detailed description. For understanding easily, the same reference numbers will refer to the same element in common.

Several kinds of offset narrow wire patterns of tapes for semiconductor package according to the embodiments of the present invention are described with conjunction of the drawings by way of example. Such examples comprise a TAB/COF tape used in a liquid crystal display (LCD) device.

Example 1

Figure 1:
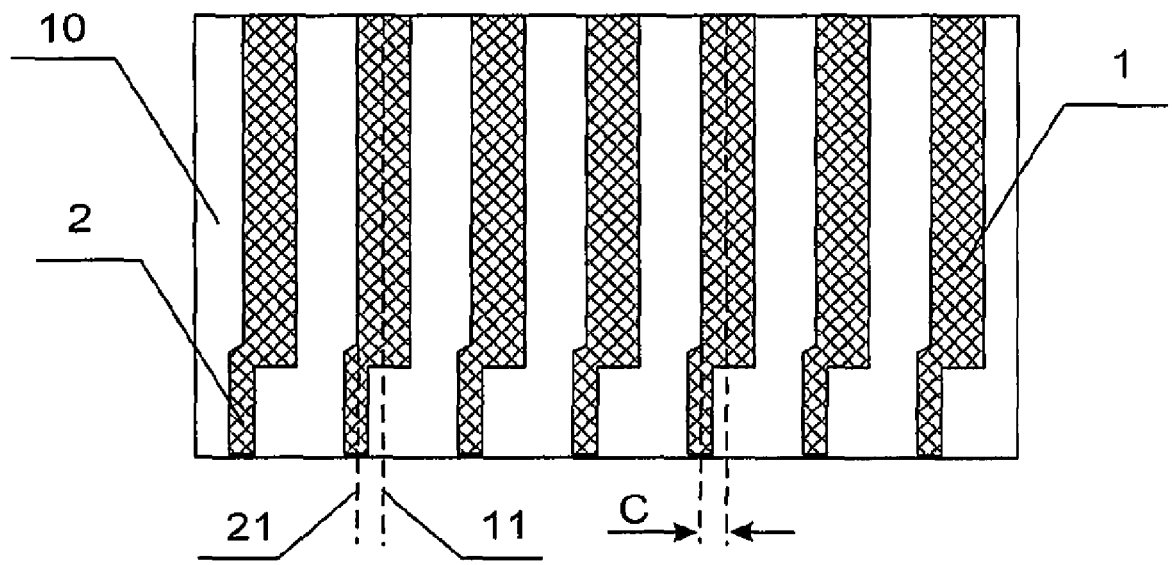
FIG. 1 is a schematic view of a left offset narrow wire pattern according to an embodiment of the present invention.

FIG. 1 is a schematic view of a left offset narrow wire pattern of a tape for semiconductor package according to an embodiment of the present invention. As shown in FIG. 1, the tape such as a TAB/COF tape comprises a base 10, and leads 1 are uniformly arranged on the base 10 in a lead pattern. A narrow wire 2 is provided on the end of each lead 1 and is connected with the end of the corresponding lead 1. All the narrow wires 2 in a cutting area are offset from the central lines 11 of the corresponding leads 1 towards a left direction so as to form a left offset narrow wire pattern. The offset distance C between a central line 21 of a narrow wire 2 and a central line 11 of the corresponding lead 1 is 11 µm~15 µm, preferably 13 µm.

Example 2

Figure 2:
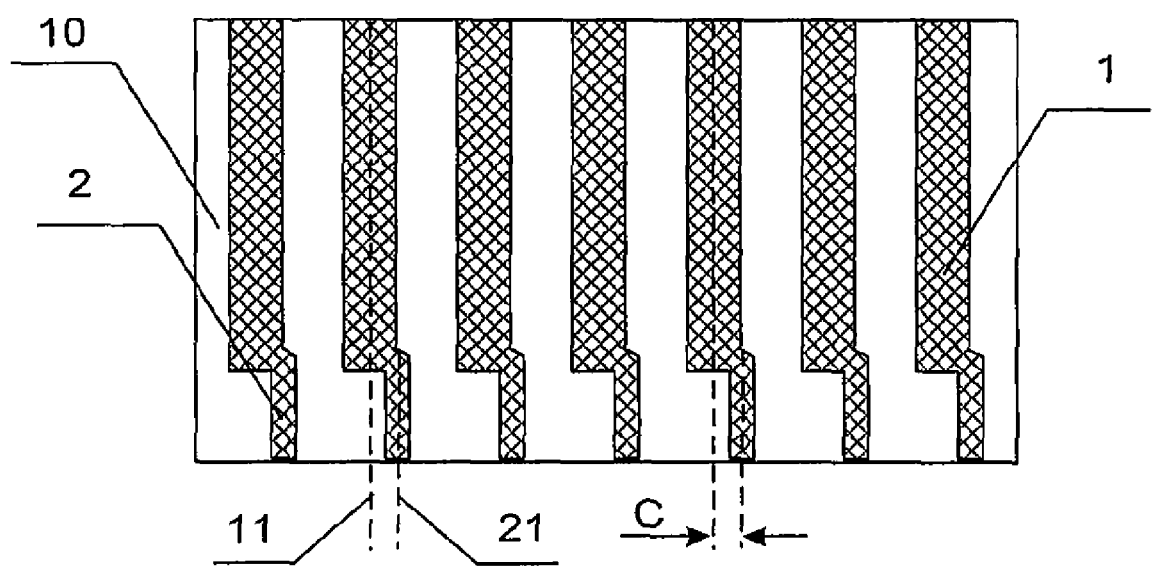
FIG. 2 is a schematic view of a right offset narrow wire pattern according to an embodiment of the present invention.

FIG. 2 is a schematic view of a right offset narrow wire pattern of a tape for semiconductor package according to an embodiment of the present invention. Different from the left narrow wire pattern as shown in FIG. 1, all the narrow wires 2 provided at ends of the corresponding leads on the base 10 are offset from the central lines 11 of the corresponding leads 1 towards a right direction so as to form a right offset narrow wire pattern in example 2. The offset distance C between a central line 21 of a narrow wire and a central line 11 of the corresponding lead 1 is 11 µm~15 µm, preferably 13 µm.

Example 3

Figure 3:
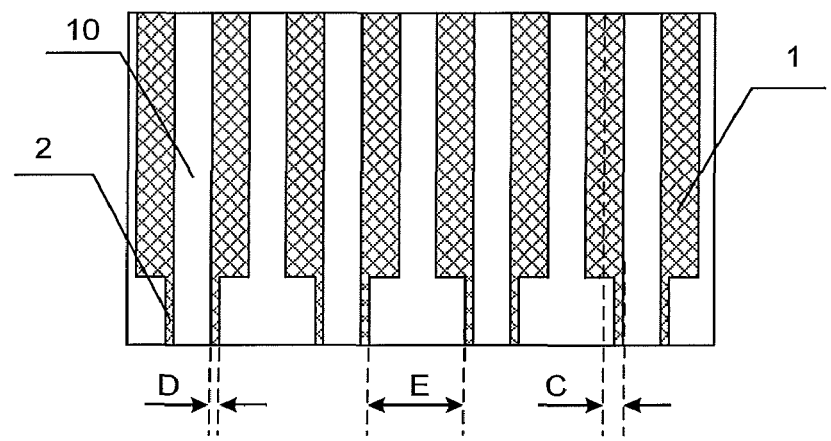
FIG. 3 and FIG. 4 are schematic views of left and right offset narrow wire patterns according to an embodiment of the present invention.
Figure 4:
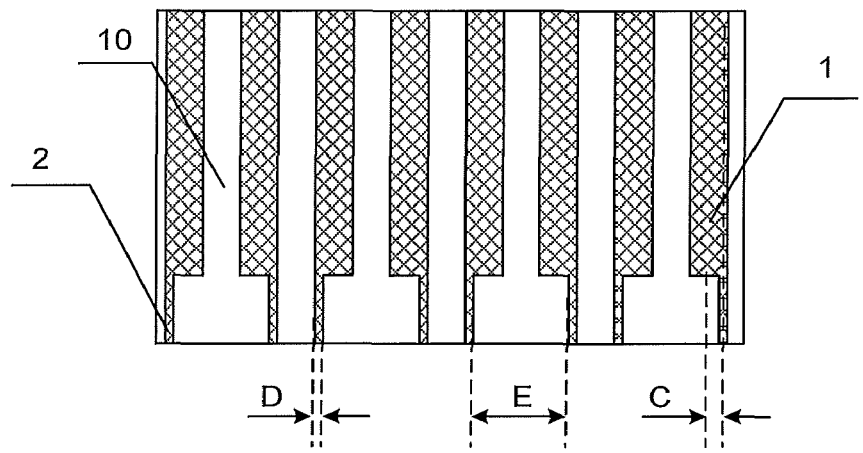

FIG. 3 and FIG. 4 are schematic views of left and right offset narrow wire patterns of tapes for semiconductor package according to an embodiment of the present invention. As shown in FIG. 3 and FIG. 4, leads 1 are uniformly provided on a base 10 of the tape. Two adjacent narrow wires 2 in a cutting area are offset from the central lines 11 of the corresponding leads 1 towards opposite directions so as to form a left and right offset narrow wire pattern.

With respect to same positions of the tape for semiconductor package, two adjacent leads 1 (e.g., two leads on the most left side) may have two different arrangement manner, that is, the two narrow wires 2 of the leads become closer to each other (as shown in FIG. 3) or far away from each other (as shown in FIG. 4) due to offsetting from the central line of the corresponding lead 1 in the opposite directions. In the left and right offset narrow wire pattern, the offset distance C between a central line of a narrow wire and a central line of the corresponding lead 1 is 11 µm~15 µm, preferably 13 µm. When width "D" of the narrow wires 2 is 4 µm~6 µm, the maximum distance E between two adjacent narrow wires 2 may be 76 µm~78 µm, and in contrast, the distance B between two adjacent narrow wires of the leads in the conventional tape is 43 µm.

Figure 5:
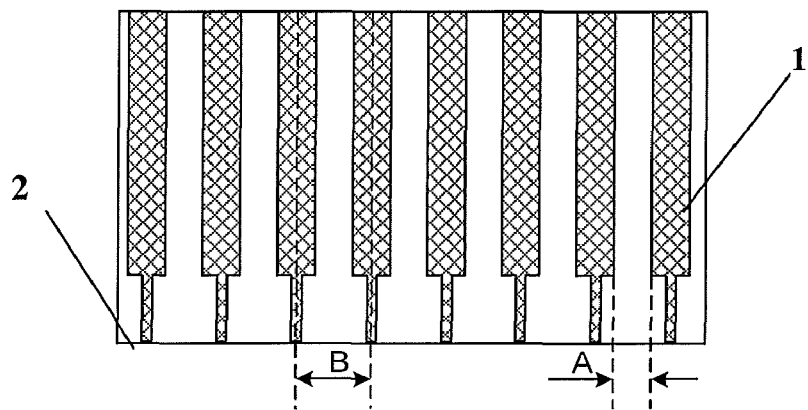
FIG. 5 is a schematic view of a conventional TAB/COF tape.

A method of cutting a tape for semiconductor package, such as a TAB/COF tape, according to an embodiment of the present invention will be described in connection with a left offset narrow wire pattern. In the cutting areas consecutively arranged on a base of a TAB/COF tape, the left offset narrow wire pattern as shown in FIG. 1 is applied in an odd cutting area on the base, while the central narrow wire pattern in the conventional tape as shown in FIG. 5 is applied in an adjacent even cutting area on the base. During the cutting process, when the odd cutting area is cut, the cutting positions where the cutting tool cuts the narrow wires is offset from the central lines of the corresponding leads 1 by 11 µm~15 µm, and when the even cutting area is cut, the cutting positions are at the central lines of the corresponding leads 1. That is, the cutting positions for every one cutting area are different and alternated, which makes the blade of the cutting tool more uniformly worn and thus lengthen the life of the cutting tool. Correspondingly, occurrence of edge burrs is reduced and thereby two-line defects in a LCD device can be avoided.

In other embodiments of the present invention, different narrow wire patterns are employed in an odd cutting areas and in an adjacent even cutting area, respectively. Therefore, any combination of a left offset narrow wire pattern, a right offset narrow wire pattern, a left and right offset narrow wire pattern (such as the above described two kinds), and a conventional central narrow wire pattern can be applied for two adjacent cutting areas, and can be used to alleviate the worn to the cutting tool and thus reduce occurrence of edge burrs when cutting with a cutting tool. Also, there may be two adjacent cutting areas that have the same the narrow wire patterns, but with respect to the all the cutting areas of the tape, the narrow wire patterns are not the same at all.

The experiment results show that after using the tape for semiconductor package and the method of cutting according to the embodiments of the present invention, the life of the cutting tool is lengthen by more than 1 factor, for example from 100,000 times of cutting to 200,000 times or more of cutting, and occurrence of edge burrs are reduced. Correspondingly, two-line defects due to occurrence of edge burrs are avoided along with reduced product cost.

It should be appreciated that the embodiments described above are intended to illustrate but not limit the present invention. Although the present invention has been described in detail herein in connection with the preferred embodiments, it should be understood by those skilled in the art that various modification and equivalents of the invention can be made herein without departing from the spirit and scope of the present invention as defined in the appended claims.

What is claimed is:

1. A tape for a semiconductor package, comprising: a base comprising a plurality of cutting areas, which are consecutively arranged along the tape and adapted to be cut in consecutive processes, wherein each cutting area on the base comprises leads of uniform width, which are arranged parallel to each other, and narrow wires of uniform length and width, which are arranged parallel to each other, a width of the narrow wires is less than that of the leads, and the cutting positions in each cutting area are provided on the narrow wires, and wherein the narrow wires are directly connected to ends of the corresponding leads and offset from the central lines of the corresponding leads all in a same manner in at least one of the cutting areas, and a narrow wire pattern offset in one of the cutting areas differs from a narrow wire pattern offset of an adjacent cutting area.

2. The tape according to claim 1, wherein an offset distance between a central line of a narrow wire and a central line of the corresponding lead is 11 µm~15 µm.

3. The tape according to claim 2, wherein the offset distance between the central line of the narrow wire and the central line of the corresponding lead is 13 µm.

4. The tape according to claim 1, wherein the tape is a tape automated bonding (TAB)/chip on film (COF) tape.

5. The tape according to claim 1, wherein the narrow wire pattern offsets of any two adjacent cutting areas are arranged differently.

6. A method for cutting a tape for a semiconductor package, the tape comprising a base comprising a plurality of cutting areas, which are consecutively arranged along the tape, wherein each cutting area on the base comprises leads of uniform width, which are arranged parallel to each other, and narrow wires of uniform length and width, which are arranged parallel to each other, a width of the narrow wires is less than that of the leads, and the cutting positions in each cutting area are provided on the narrow wires, and wherein the narrow wires are directly connected to ends of the corresponding leads and offset from the central lines of the corresponding leads all in a same manner in at least one of the cutting areas, and a narrow wire pattern offset in one of the cutting areas differs from a narrow wire pattern offset of an adjacent cutting area; and wherein the cutting areas are consecutively arranged along the tape and cut consecutively.

7. The method according to claim 6, wherein the narrow wire pattern offsets of any two adjacent cutting areas are arranged differently.

8. The method according to claim 6, wherein an offset distance between a central line of a narrow wire and a central line of the corresponding lead is 11 µm~15 µm.

9. The method according to claim 8, wherein the offset distance between the central line of the narrow wire and the central line of the corresponding lead is 13 µm.

10. The method according to claim 6, wherein the tape is a tape automated bonding (TAB)/chip on film (COF) tape.

11. A tape for a semiconductor package, comprising: a base comprising a plurality of cutting areas, which are consecutively arranged along the tape and adapted to be cut in consecutive processes, wherein each cutting area on the base comprises leads of uniform width, which are arranged parallel to each other, and narrow wires of uniform length and width, which are directly connected to ends of the corresponding leads and arranged parallel to each other, a width of the narrow wires is less than that of the leads, and cutting positions in each cutting area are provided on the narrow wires, and wherein the narrow wires in at least one of the cutting areas are offset from central lines of the corresponding leads, and the adjacent narrow wires are arranged in pairs, which are same as each other, and in each pair the narrow wires are offset from the central lines of the corresponding leads towards opposite directions, and a narrow wire pattern offset in one of the cutting areas differs from another narrow wire pattern offset in another cutting area.

12. The tape according to claim 11, wherein an offset distance between a central line of a narrow wire and a central line of the corresponding lead is 11 µm~15 µm.

13. The tape according to claim 11, wherein the tape is a tape automated bonding (TAB)/chip on film (COF) tape.

14. The tape according to claim 11, wherein the narrow wire pattern offsets of any two adjacent cutting areas are arranged differently.

* * * * *